United States Patent
Loeffler (12)

(10) Patent No.: US 6,177,810 B1
(45) Date of Patent: Jan. 23, 2001

(54) ADJUSTABLE STRENGTH DRIVER CIRCUIT AND METHOD OF ADJUSTMENT

(75) Inventor: Steffen Loeffler, Essex Junction, VT (US)

(73) Assignee: Siemens Aktiengesellschaft, Munich (DE)

(*) Notice: Under 35 U.S.C. 154(b), the term of this patent shall be extended for 0 days.

(21) Appl. No.: 09/215,607

(22) Filed: Dec. 17, 1998

(51) Int. Cl.$^7$ ................ H03K 19/094; H03K 19/0175
(52) U.S. Cl. ........................ 326/87; 326/83; 326/86; 365/189.05
(58) Field of Search ............................ 326/83, 86, 87, 326/85, 91; 365/230.03, 189.05

(56) References Cited

U.S. PATENT DOCUMENTS

| | | | | |
|---|---|---|---|---|
| 4,855,623 | * | 8/1989 | Flaherty | 326/87 |
| 5,089,722 | * | 2/1992 | Amedeo | 326/87 |
| 5,153,450 | * | 10/1992 | Ruetz | 326/87 |
| 5,268,597 | | 12/1993 | Fong | 307/443 |
| 5,319,258 | * | 6/1994 | Ruetz | 326/21 |
| 5,331,220 | * | 7/1994 | Pierce et al. | 326/57 |
| 5,398,318 | * | 3/1995 | Hiraishi et al. | 326/83 |
| 5,568,062 | * | 10/1996 | Kaplinsky | 326/27 |
| 5,717,343 | | 2/1998 | Kwong | 326/27 |
| 5,732,027 | * | 3/1998 | Arcoleo et al. | 365/189.05 |
| 5,864,506 | * | 1/1999 | Arcoleo et al. | 365/189.05 |
| 5,943,263 | * | 8/1999 | Roohparvar | 365/185.18 |

FOREIGN PATENT DOCUMENTS

| | | |
|---|---|---|
| 0608615 | 3/1994 | (JP). |
| 08181594 | 12/1996 | (JP). |
| 01032523 | 2/1999 | (JP). |

OTHER PUBLICATIONS

Rhyne, "Fundamentals of Digital Systems Design", N.J. pp. 70–71, 1973.*

* cited by examiner

Primary Examiner—Michael Tokar
Assistant Examiner—Daniel D. Chang
(74) Attorney, Agent, or Firm—Donald B. Paschburg

(57) ABSTRACT

An output buffer, in accordance with the present invention includes a first driver circuit for coupling a first voltage to an output when the first driver circuit is turned on, and a second driver circuit for coupling a second voltage to the output when the second driver circuit is turned on. An input connects to the first and second driver circuits for turning the first and second driver circuits on and off according to a first input signal. An adjustment circuit is coupled to the first and second driver circuits for adjusting the strength of the first and second driver circuits according to a data pattern, the data pattern including the first input signal and input signals of a plurality of output buffers. Also, included is a method for adjustment of driver strength of the output buffer.

22 Claims, 4 Drawing Sheets

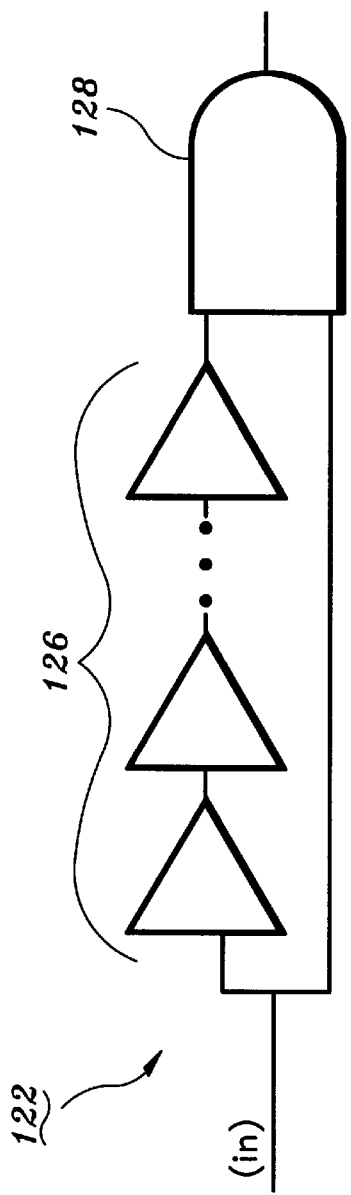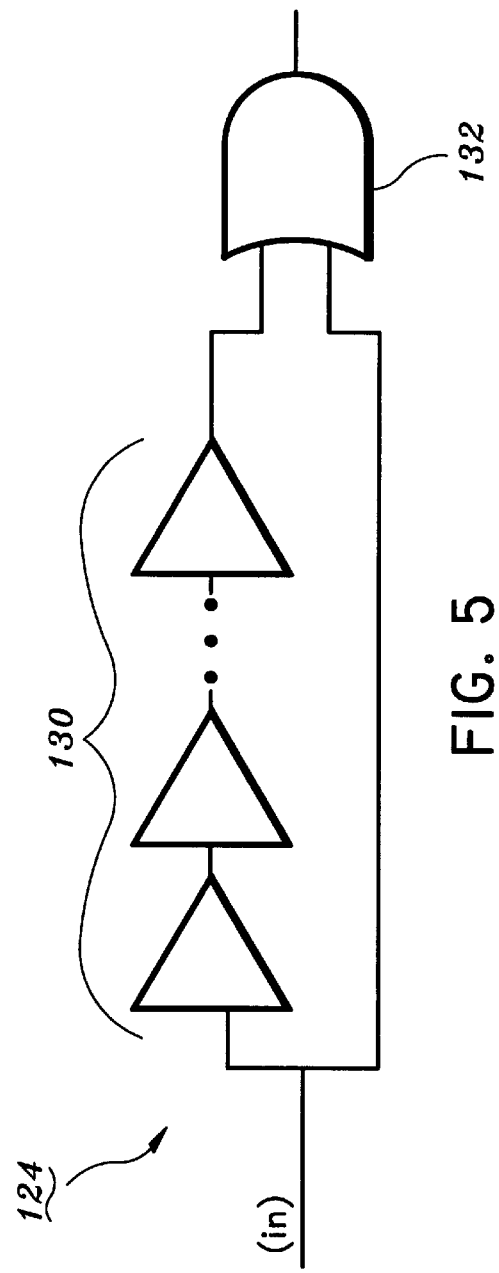
FIG. 4
FIG. 5

ADJUSTABLE STRENGTH DRIVER CIRCUIT AND METHOD OF ADJUSTMENT

BACKGROUND

1. Technical Field

This disclosure relates to semiconductor devices and more particularly, to an adjustable strength driver circuit for off chip drivers used in semiconductor memories and a method of adjustment.

2. Description of the Related Art

Semiconductor memories, such as dynamic random access memories (DRAMs), include an off chip driver (OCD) or an output buffer which provide a signal to be sent off the semiconductor chip during operation. A memory chip often includes an array of output buffers to permit simultaneous output of multiple databits. When several of the drivers of the array of buffers are in operation, the rise and/or fall time of the outgoing signals are slowed down. This is true for signals driven off the memory chip. The slow down is caused primarily by power and ground supply noise, and the resulting decrease in a gate to drain voltage ($V_{gs}$) and drain to source voltage ($V_{ds}$) of driver transistors of the buffer array. The load at the output is driven by less overdrive voltage $V_{gs}$ and less voltage difference $V_{ds}$ between source and drain of the driving transistor.

In DRAMs, there are typically between 4 to 32 output buffers, arranged in an array, and having a dedicated power supply. Package parasitics include inductances of a lead frame and a bond wire and capacitive loads including internal and external output loads as indicated in FIG. 1. When, as a worst case, a majority of output buffers have to drive data of a same polarity (either "0" or "1", single-sided), this causes a decrease of $V_{gs}$ and $V_{ds}$, over the driving transistor. This slows down the rising or falling edge of the output signal and results in a lower speed performance of the DRAM. Although the rising or falling edge delay may be compensated for by increasing the width of the driving transistor, this cannot be performed dynamically and may therefore violate maximum slew rates in best cases.

Referring to FIG. 1, a typical output buffer 10 is shown having parasitic load 12 and capacitive loads 13 and 15 associated with lead frame and bond wire. Output buffer 10 includes two driving transistors 14 and 16. Transistor 14 is driven by an n-logic signal while transistor 16 is driven by a p-logic signal. Transistor 14 has a source coupled to a first supply voltage (i.e., VSSD) while transistor 16 has a source coupled to a second supply voltage (VDDQ). When n-logic drives transistor 14 (which is an NFET pull transistor) to drive node OUT low, node 2 will temporarily bounce up (dI/dt noise, i.e., <U=L∃dI/dt where <U; is voltage variation caused by parasitic inductances L and dI/dt is the derivative of the current with respect to time). This voltage change caused by the inductance is not negligible and may significantly contribute to the decrease in $V_{gs}$ and $V_{ds}$ for transistor 14. When a majority of output buffers in an array drive the same data (1's or 0's), this effect is further enhanced and causes a slowing down of the signal's OUT falling edge because $V_{gs}$ and $V_{ds}$ decrease further. Output timings become data pattern dependent resulting in reduced timing margins especially when the DRAM chip is operated at high frequencies.

Therefore, a need exists for an output buffer which dynamically adjusts the drive strength according to a data pattern to be output from an array of output buffers in its vicinity.

SUMMARY OF THE INVENTION

An output buffer, in accordance with the present invention includes a first driver circuit for coupling a first voltage to an output when the first driver circuit is turned on, and a second driver circuit for coupling a second voltage to the output when the second driver circuit is turned on. An input connects to the first and second driver circuits for turning the first and second driver circuits on and off according to a first input signal. An adjustment circuit is coupled to the first and second driver circuits for adjusting the strength of the first and second driver circuits according to a data pattern, the data pattern including the first input signal and input signals of a plurality of output buffers.

In alternate embodiments, the data pattern preferably includes bits, and the adjustment circuit adjusts the strength of the first and second driver circuits according to a number of bits having a same value. The first and the second driver circuits preferably include field effect transistors. The adjustment circuit preferably adjusts the strength of the driver circuits according to a graduated strength scale, the number of graduations being the number of inputs of the data pattern plus one. The adjustment circuit may overdrive the driver circuits to adjust the driver circuit strength. The adjustment circuit may include logic circuitry to adjust the first and second driver circuits. The plurality of output buffers may be disposed in an array of output buffers and may include adjacent output buffers.

Another output buffer includes a first driver device for coupling a first voltage to an output when the first driver device is turned on, and a second driver device for coupling a second voltage to the output when the second driver device is turned on. An input is connected to the first and second driver devices for turning the first and second driver devices on and off according to a first input signal. A NOR gate is provided having an output coupled to a first driver circuit for turning the first driver circuit on and off, the first driver circuit for coupling the first voltage to the output when the first driver circuit is turned on. A NAND gate is also provided having an output coupled to a second driver circuit for turning the second driver circuit on and off, the second driver circuit for coupling the second voltage to the output when the second driver circuit is turned on. The NOR gate and NAND gate receive an input data pattern such that upon logically combining the plurality of inputs the first and second driver circuits are turned on and off in conjunction with the first and second driver devices to adjust a driving strength to the output according to the data pattern, the data pattern including the first input signal and input signals of a plurality of output buffers.

In other embodiments, the data pattern preferably includes bits, and the driving strength to the output may be adjusted when the data pattern includes all bits having a same value. The first and the second driver devices preferably include field effect transistors. The first and second driver circuits include field effect transistors of the same type as the first and the second driver devices, respectively. The driver devices may include gates for activation of the driver devices, the gates being overdriven to adjust driver circuit strength. The plurality of output buffers may be disposed in an array of output buffers and may include adjacent output buffers. The first and second driver circuits may each include a control circuit which outputs a pulse to activate at least one driver device to assist in adjusting the driver strength of one of the first driver device and the second driver device.

A method for adjusting driver strength for output buffers includes the steps of providing an output buffer including a first driver circuit for coupling a first voltage to an output when the first driver circuit is turned on, a second driver circuit for coupling a second voltage to the output when the second driver circuit is turned on, an input connected to the first and second driver circuits for turning the first and second driver circuits on and off according to a first input signal and an adjustment circuit coupled to the first and second driver devices for adjusting the strength of the first and second driver circuits according to a data pattern, the data pattern including the first input signal and input signals of a plurality of output buffers, inputting the data pattern into the adjustment circuit, adjusting the strength of the first and second driver circuits according a number of high and low bits in the data pattern and outputting the first input signal.

In alternate methods, the step of adjusting may include the step of adjusting the strength of the driver circuits when the data pattern includes bits all having the same value. The driver circuits may include transistors with gates for activating the transistors and may further include the step of overdriving the gates to adjust driver circuit strength. The step of adjusting the strength of the first and second driver circuits according a number of same bits in the data pattern may include the steps of summing one of the bits, comparing the sum of the bits to a graduated scale of driver strengths and adjusting the driver strength according to the scale. The step of adjusting the strength of the first and second driver circuits according a number same bits in the data pattern may include the steps of inputting the data pattern into a logic gate and adjusting the driver strength according to an output of the logic gate. The step of adjusting the driver strength according to the output of the logic gate may include adjusting the driver strength when the data pattern has all bits of the same value. The logic gate may include a NAND gate and/or a NOR gate.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 4 is a schematic diagram of a control circuit for outputting pulses for adjusting driver strength by driving gates of the drivers of the output buffer in accordance with the present invention; and FIG. 5 is a schematic diagram of another control circuit for outputting pulses for adjusting driver strength by driving gates of the drivers of the output buffer in accordance with the present invention.

DETAILED DESCRIPTION OF PREFERRED EMBODIMENTS

This disclosure relates to semiconductor devices and more particularly, to an adjustable strength driver circuit for off chip drivers used in semiconductor memories. In accordance with the present invention, a proper adjustment of the drive strength of an individual output buffer or off chip driver (OCD) of an array of OCD's is provided. Data to be driven from a dynamic random access memory (DRAM) is known in advance of being driven by the OCD and the array of OCD's. The drive strength can therefore be adjusted and optimized depending on the data pattern to be output from the array of OCD's. The present invention will now be described by way of example for a DRAM output buffer. Other devices are contemplated for use with the present invention where it is advantageous to adjust driver strength.

Figure 1:
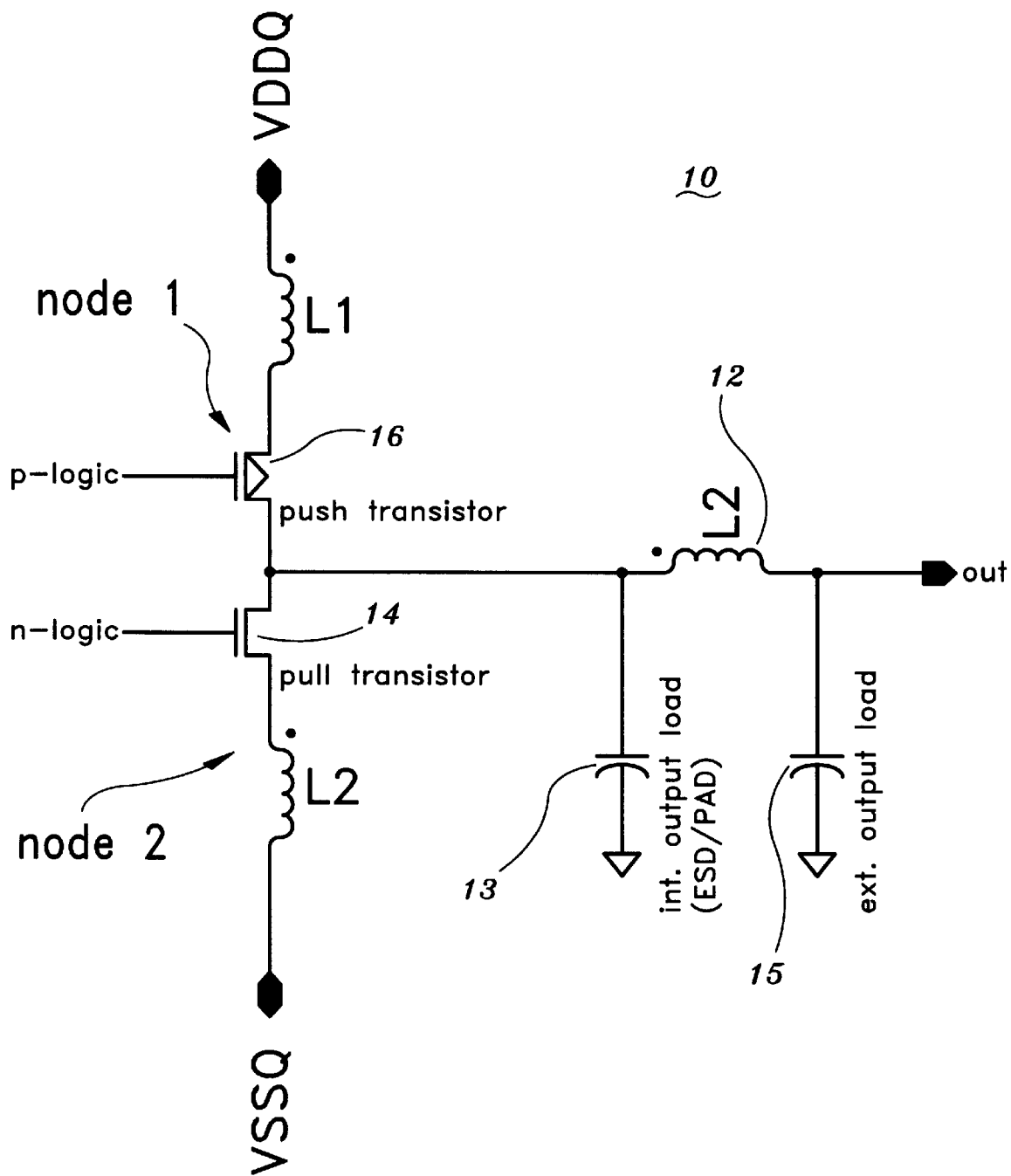
FIG. 1 is a schematic diagram of an output buffer for a dynamic random access memory in accordance with the prior art.
Figure 2:
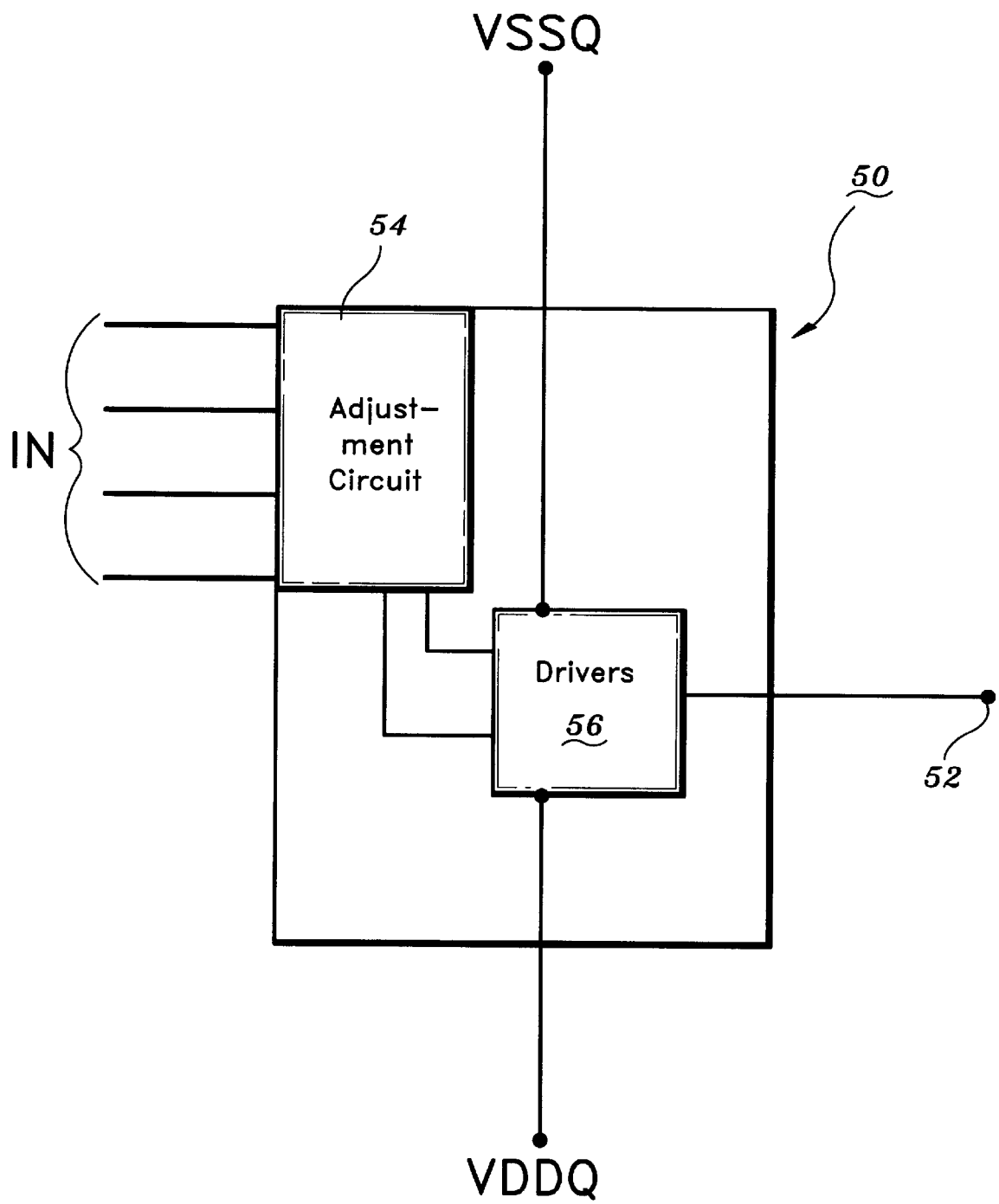
FIG. 2 is a schematic diagram of an output buffer having an adjustment circuit for adjusting driver strength of the output buffer in accordance with the present invention.

Referring now in specific detail to the drawings in which like reference numerals identify similar or identical elements throughout the several views, and initially to FIG. 2, an output buffer 50 is provided. An adjustment circuit 54 includes a group of inputs (IN) which share a VSSQ/VDDQ pair. The number of inputs may be greater or less depending on the design. One input represents the output signal to be driven at output 52 while the other inputs represent the outputs of output buffers in the vicinity of buffer 50. The data in this group of inputs can be evaluated in advance using a sum of all bits approach. The input bits have a voltage of either high (VDDQ) or low (0). Driver strength, i.e., the strength of the driving transistors, for a driver circuit 56 is adjusted according to TABLE 1 where the sums of the data states are equated to a driver strength which includes a graduated strength scale having as the number of graduations the sum of the inputs+1. Since circuit 54 has 4 inputs, TABLE 1 illustratively includes 5 graduations of strength for the driver transistor(s). In accordance with a data pattern on DQs, adjustment circuit 54 calculates the strength needed to properly drive output 52. Drive strength is modified in one embodiment by selecting an appropriately sized transistor based on the strength needed, i.e., TABLE 1.

TABLE 1

| Option | $\sum_{i=1}^{4}(bDQ_j = 0)$ | $bDQ_j$ | Modify drive devices for $DQ_j$ |
|---|---|---|---|
| 1 | 4 | 0 | activate additional strong driver device |
| 2 | 3 | 0 | activate additional weak driver device |
|   |   | VDDQ | use default drive strength |
| 3 | 2 | 0 | use default drive strength |
|   |   | VDDQ | use default drive strength |
| 4 | 1 | VDDQ | activate additional weak driver device |
|   |   | 0 | use default drive strength |
| 5 | 0 | VDDQ | activate additional strong driver device |

$\Sigma(bDQ_j=0)$ is the sum of input data bits being zero for i buffers in the group (in this case, 4 buffers are grouped). $bDQ_j$ is the input of the buffer that has its drive strength adjusted. The additional driver devices may be represented connected as ansistors 106 and 110 of FIG. 3. In one embodiment, additional strong and weak transistors are PFETs for options 1 and 2, and strong and weak transistors are NFETs for options 4 and 5. To provide all additional options in Table 1 additional drivers may be added. The results of the strength adjustment may be implemented by increasing the number of driver transistors, increasing their width or using the drivers to overdrive an appropriate gate to avoid the drop of $V_{gs}$ below a lower threshold. In this way, driver strength in buffer 50 may be adjusted in accordance with the data pattern input to the output drivers in its vicinity. Additional drive transistors may be added by connecting sources and drains of the additional transistors across the same nodes as transistors 106 and 110 of FIG. 3. Adjustment circuit 54 preferably controls which transistors are activated in accordance with the invention.

Figure 3:
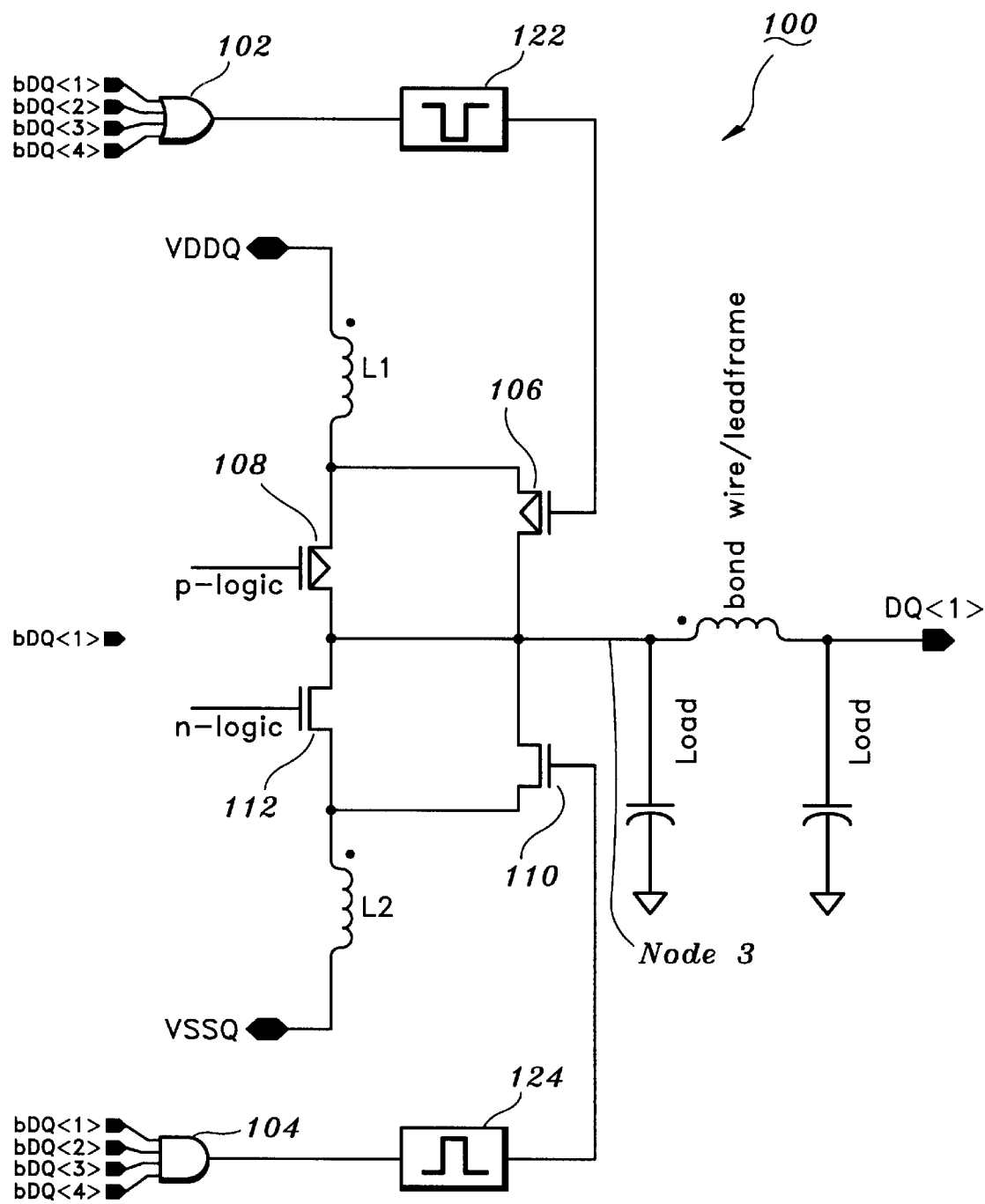
FIG. 3 is a schematic diagram of an output buffer having an adjustment circuit including NAND and NOR gates for adjusting driver strength of the output buffer in accordance with the present invention.

Referring to FIG. 3, an off chip driver circuit 100 is shown in accordance with the present invention. Circuit 100 includes a NOR gate 102 and a NAND gate 104. NOR gate 102 and NAND gate 104 receive a same set of inputs from a data pattern to be driven by an array of output buffers (OCD's). A set of pins or DQs carry the output signal of the OCD. These DQs are grouped and supplied by a specific VDDQ/VSSQ pair. The data in the illustrative embodiment shown in FIG. 3 includes 4 DQs being shared by the VDDQ/VSSQ pair. However, the number of DQs may be greater or less as well.

NOR gate 102 has its output coupled to a circuit 122 which creates a low going pulse when the output of NOR 102 is rising. The output of circuit 122 is coupled to a gate of transistor 106. PFET transistor has its source coupled to the source of a transistor 108. Transistors 106 and 108 are preferably transistors of a same conductivity, and more preferably PFET transistors. The sources of transistors 106 and 108 are coupled to VDDQ, and the drains of transistors 106 and 108 are connected to node 3. NAND gate 104 has its output coupled to a circuit 124 which creates a high going pulse when the output of NAND gate 104 is falling. The output of circuit 124 is coupled to a gate of transistor 110. NFET transistor has its source coupled to the source of a transistor 112. Transistors 110 and 112 are preferably transistors of a same conductivity, and more preferably NFET transistors. The sources of transistors 110 and 112 are coupled to VSSQ, and the drains of transistors 110 and 112 are connected to node 3. The gates of transistors 108 and 112 include an input signal line (bDQ<1>) for activating transistors 108 and 112. Transistor 106, 108, 110 and 112 are all driving transistors.

Inputs to NOR and NAND gates 102 and 104, respectively, include data to be output by this and other OCD's (corresponding to DQ<1:4>) in the array in the vicinity of the OCD of circuit 100. These inputs include bDQ<1:4>. NOR gate 102 and NAND gate 104 provide driver strength compensation for worst cases (all 1's or all 0's) in the vicinity of circuit 100. Inputs bDQ are NORed and NANDed, and the outputs of NOR gate 102 and NAND gate 104 are used to activate additional driver transistors 106 and 110. In this way, driver strength is increased for the worst case data pattern of all 1's or all 0's, in accordance with the present invention. The same scheme may be utilized to either evaluate a greater number of DQ data or to add more discrete levels to the strength adjustment. The timing of the activation of the additional drive transistors 106 and 110 may be selected to comply with design specifications, e.g., maximum and/or minimum currents, etc.

FIG. 3 shows a circuit capable of implementing options 1, 3 and 5 shown in Table 1 above. Option 3 uses default driver strength. Option 1 is implemented when bDQs are low. Output of NOR gate 102 goes high and generates a low pulse (of variable width) on a signal which is otherwise held high. This signal activates transistor 106 (which functions as a strong transistor in Table 1) and assists transistor 108 in driving output DQ(i) high. Output of NAND gate 104 stays high, and transistors 112 and 110 are not switched on. Option 5 is implemented when all bDQs are high. Output of NOR gate 102 stays low, and transistors 106 and 108 are not switched on. Output of NAND gate 104 goes low and generates a high pulse (of variable width). Transistors 110 (which functions as a strong transistor in Table 1) and 112 are switched on and drive the output DQ(i) low. In all other combinations, transistor 108 or transistor 112 is active.

Circuit 122 provides the pulse shown in FIG. 3. Referring to FIG. 4, circuit 122 preferably includes an input (in) split into two legs. One leg includes a series of inverters 126 which are coupled to a NAND gate 128. NAND gate 128 NANDs the input and the output of the inverters 126 to generate the low going pulse as described for FIG. 3. Circuit 124 provides the pulse shown in FIG. 3. Referring to FIG. 5, circuit 124 preferably includes an input (in) split into two legs. One leg includes a series of inverters 130 which are coupled to a NOR gate 132. NOR gate 132 NORs the input and the output of the inverters 130 to generated the high going pulse as described for FIG. 3.

The embodiments described above for the present invention include a device which can quickly adjust the drive strength of an OCD. Data are known in advance of driving the output, therefore, setting up the drivers can be performed efficiently. Only the OCDs which need additional drive strength receive it. In preferred embodiments, drive strength may be optimized with respect to package parasitics. In combination with trim fuses or other devices, the present invention can be used to optimize a DRAM for its specific application environment.

Having described preferred embodiments for a novel adjustable strength driver circuit device for semiconductor memories (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An output buffer, comprising:
   a first driver circuit for coupling a first voltage to an output when the first driver circuit is turned on;
   a second driver circuit for coupling a second voltage to the output when the second driver circuit is turned on;
   an input connected to the first and second driver circuits for turning the first and second driver circuits on and off according to a first input signal; and
   an adjustment circuit coupled to the first and second driver circuits for adjusting the strength of the first and second driver circuits according to a data pattern, the data pattern including the first input signal and input signals of a plurality of output buffers.

2. The output buffer as recited in claim 1, wherein the data pattern includes bits, and the adjustment circuit adjusts the strength of the first and second driver circuits according to a number of bits having a same value.

3. The output buffer as recited in claim 1, wherein the first and the second driver circuits include field effect transistors.

4. The output buffer as recited in claim 1, wherein the adjustment circuit adjusts the strength of the driver circuits according to a graduated strength scale, the number of graduations being the number of inputs of the data pattern plus one.

5. The output buffer as recited in claim 1, wherein the adjustment circuit overdrives the driver circuits to adjust the driver circuit strength.

6. The output buffer as recited in claim 1, wherein the adjustment circuit includes logic circuitry to adjust the first and second driver circuits.

7. The output buffer as recited in claim 1, wherein the plurality of output buffers are disposed in an array of output buffers and include adjacent output buffers.

8. An output buffer comprising:

a first driver device for coupling a first voltage to an output when the first driver device is turned on;

a second driver device for coupling a second voltage to the output when the second driver device is turned on;

an input connected to the first and second driver devices for turning the first and second driver devices on and off according to a first input signal;

a NOR gate having an output coupled to a first driver circuit for turning the first driver circuit on and off, the first driver circuit for coupling the first voltage to the output when the first driver circuit is turned on;

a NAND gate having an output coupled to a second driver circuit for turning the second driver circuit on and off, the second driver circuit for coupling the second voltage to the output when the second driver circuit is turned on; and the NOR gate and NAND gate receiving an input data pattern such that upon logically combining data of the input data pattern the first and second driver circuits are turned on and off in conjunction with the first and second driver devices to adjust a driving strength to the output according to the input data pattern, the input data pattern including the first input signal and input signals of a plurality of output buffers.

9. The output buffer as recited in claim 8, wherein the data pattern includes bits, and the driving strength to the output is adjusted when the data pattern includes all bits having a same value.

10. The output buffer as recited in claim 8, wherein the first and the second driver devices include field effect transistors.

11. The output buffer as recited in claim 10, wherein the first and second driver circuits include field effect transistors of the same type as the first and the second driver devices, respectively.

12. The output buffer as recited in claim 8, wherein the first and second driver devices include gates for activation of the first and second driver devices, the gates being overdriven to adjust a strength of the first and second driver circuits.

13. The output buffer as recited in claim 8, wherein the plurality of output buffers are disposed in an array of output buffers and include adjacent output buffers.

14. The output buffer as recited in claim 8, wherein the first and second driver circuits each includes:

a control circuit which outputs a pulse to activate at least one driver device to assist in adjusting the driver strength of one of the first driver device and the second driver device.

15. The output buffer as recited in claim 8, wherein the strength of the first and second driver circuits is adjusted in accordance with a graduated strength scale, the number of graduations of the graduated strength scale being the number of inputs of the input data pattern plus one.

16. A method for adjusting driver strength for output buffers, comprising the steps of:

providing an output buffer including a first driver circuit for coupling a first voltage to an output when the first driver circuit is turned on, a second driver circuit for coupling a second voltage to the output when the second driver circuit is turned on, an input connected to the first and second driver circuits for turning the first and second driver circuits on and off according to a first input signal and an adjustment circuit coupled to the first and second driver devices for adjusting the strength of the first and second driver circuits according to a data pattern, the data pattern including the first input signal and input signals of a plurality of output buffers;

inputting the data pattern into the adjustment circuit;

adjusting the strength of the first and second driver circuits according a number of bits in the data pattern having a same value; and outputting the first input signal.

17. The method as recited in claim 16, wherein the step of adjusting includes the step of adjusting the strength of the driver circuits when the data pattern includes all bits having a same value.

18. The method as recited in claim 16, wherein the driver circuits include transistors with gates for activating the transistors and further comprising the step of overdriving gates to adjust driver circuit strength.

19. The method as recited in claim 16, wherein the step of adjusting the strength of the first and second driver circuits includes the steps of:

summing the bits;

comparing the sum of the bits to a graduated scale of driver strengths; and adjusting the driver strength according to the scale.

20. The method as recited in claim 16, wherein the step of adjusting the strength of the first and second driver circuits includes the steps of:

inputting the data pattern into a logic gate; and adjusting the driver strength according to an output of the logic gate.

21. The method as recited in claim 20, wherein the logic gate includes one of a NAND gate and a NOR gate.

22. The method as recited in claim 20, wherein the step of adjusting the driver strength according to the output of the logic gate includes adjusting the driver strength when the data pattern has all bits of a same value.

* * * * *